(12) United States Patent
Nallan et al.

(10) Patent No.: US 6,759,340 B2
(45) Date of Patent: Jul. 6, 2004

(54) METHOD OF ETCHING A TRENCH IN A SILICON-ON-INSULATOR (SOI) STRUCTURE

(76) Inventors: Padmapani C. Nallan, 2200 Pettigrew Dr., San Jose, CA (US) 95148; Ajay Kumar, 510 Kenilworth Ct., Sunnyvale, CA (US) 94087; Anisul H. Khan, 3450 Tracy Dr., Santa Clara, CA (US) 95051; Chan-Syun David Yang, 5711 Tubac La., San Jose, CA (US) 95118

( * ) Notice: Subject to any disclaimer, the term of this patent is extended or adjusted under 35 U.S.C. 154(b) by 0 days.

(21) Appl. No.: 10/143,269

(22) Filed: May 9, 2002

(65) Prior Publication Data

US 2003/0211753 A1 Nov. 13, 2003

(51) Int. Cl.$^7$ ............................................. H01L 21/302
(52) U.S. Cl. ........................ 438/714; 438/717; 438/736; 438/719; 438/734
(58) Field of Search ............................. 438/714, 725, 438/717, 736, 719, 734

(56) References Cited

U.S. PATENT DOCUMENTS

| | | | |
|---|---|---|---|
| 4,533,430 A | 8/1985 | Bower | 156/643 |
| 4,579,623 A | 4/1986 | Suzuki et al. | 156/626 |
| 4,985,114 A | * 1/1991 | Okudaira et al. | 216/37 |
| 5,498,312 A | 3/1996 | Laermer et al. | 156/643.1 |
| 5,501,893 A | 3/1996 | Laermer et al. | 428/161 |
| 5,705,433 A | 1/1998 | Olson et al. | 437/233 |
| 5,863,839 A | 1/1999 | Olson et al. | 438/695 |
| 6,051,503 A | 4/2000 | Bhardwaj et al. | 438/705 |
| 6,127,273 A | 10/2000 | Laermer et al. | 438/709 |
| 6,284,148 B1 | 9/2001 | Laermer et al. | 216/37 |
| 6,372,655 B2 * | 4/2002 | Khan et al. | 438/714 |
| 6,391,788 B1 * | 5/2002 | Khan et al. | 438/714 |
| 6,583,065 B1 * | 6/2003 | Williams et al. | 438/714 |

FOREIGN PATENT DOCUMENTS

| | | |
|---|---|---|
| EP | 0363982 | 4/1990 |
| JP | 59-103338 | * 6/1984 |
| JP | 61-144827 | * 7/1986 |
| JP | 63013334 | 1/1988 |
| WO | WO 00/67307 | 11/2000 |
| WO | WO 01/09934 | 2/2001 |

OTHER PUBLICATIONS

C. Takahashi, "Anisotropic Etching of Si and WSiN Using ECR Plasma of $SF_6$–$CF_4$ Gas Mixture", Jpn. J. Appl. Phys., vol. 39, pp. 3672–3676 (2000).

Copy of Search Report in corresponding PCT Application Ser. No. PCT/US03/13639, filed Apr. 30, 2003.

(List continued on next page.)

*Primary Examiner*—George A. Goudreau
(74) *Attorney, Agent, or Firm*—Joseph Bach; Shirley L. Church

(57) ABSTRACT

Disclosed herein is a method of etching a trench in silicon overlying a dielectric material which reduces or substantially eliminates notching at the base of the trench, while reducing scalloping on the sidewalls of the trench. The method comprises etching a first portion of a trench by exposing a silicon substrate, through a patterned masking layer, to a plasma generated from a fluorine-containing gas. This etching is followed by a polymer deposition step comprising exposing the substrate to a plasma generated from a gas which is capable of forming a polymer on etched silicon surfaces. The etching and polymer deposition steps are repeated for a number of cycles, depending on the desired depth of the first portion of the trench. The final portion of the trench is etched by exposing the silicon to a plasma generated from a combination of a fluorine-containing gas and a polymer-forming gas.

29 Claims, 6 Drawing Sheets

OTHER PUBLICATIONS

S. Franssila et al., "Etching through silicon wafer in inductively coupled plasma", *Microsystem Technologies*, vol. 6, pp. 141–144 (2000).

C. Gormley et al., "HARM Processing Techniques for MEMS and MOEMS Devices using Bonded SOI Substrates and DRIE", *Proceedings of SPIE*, vol. 4174, pp. 98–110 (2000).

G. S. Hwang et al., "On the origin of the notching effect during etching in uniform high density plasmas", *J. Vac. Sci. Technol.* B, vol. 15, No. 1, pp. 70–87 (1997).

K. Yu et al., "Deep anisotropic ICP plasma etching designed for high volume MEMS manufacturing", *Proceedings of SPIE*, vol. 3874, pp. 218–226 (1999).

* cited by examiner

METHOD OF ETCHING A TRENCH IN A SILICON-ON-INSULATOR (SOI) STRUCTURE

BACKGROUND OF THE INVENTION

1. Field of the Invention

The present invention pertains to a method of etching a trench in a silicon-on-insulator (SOI) structure. In particular, the present invention is a method of etching a trench in silicon overlying a dielectric material, where etching is performed using a plasma generated from a combination of a fluorine-containing etchant gas and a passivation gas.

2. Brief Description of the Background Art

Deep trench silicon etching is one of the principal technologies currently being used to fabricate microstructure devices, and is an enabling technology for many microelectromechanical systems (MEMS) applications. Currently, the most commonly used single-crystal silicon deep trench etch process is based upon a cyclic plasma etch/polymer deposition method. The process enables the removal of at least one micron (1 $\mu$m) of silicon per etch cycle. During the etch portion of the etch/deposition process, the principal etchant is often $SF_6$, which may be used in combination with a diluent so that the $SF_6$ concentration in the etchant plasma source gas is about 75% or greater by volume. During the polymer deposition portion of the process, a plasma generated from polymer-forming gases such as $CHF_3$ is introduced to the chamber to produce polymer coatings on the trench sidewall. The polymer coating helps prevent lateral etching of the trench sidewall during a vertical etch portion of a subsequent cycle.

The cycling of gases in the etch/deposition process introduces a unique type of sidewall roughness known as scalloping. FIG. 1 shows an open area 104 etched in a silicon substrate 102 to form a silicon trench sidewall 206 exhibiting 0.8 micron deep (d) scallops 108. Scalloping occurs because the $SF_6$ etch is relatively isotropic. Because of the discontinuous etch and deposition steps in a silicon etch/polymer deposition process, the etch profile of a single etch step is not flat, but rather it is concave with respect to etched open area 104. Every etch/deposition cycle leaves a concave scallop 108 on the trench sidewall. This shape is then repeated for each successive etch step, resulting in a sidewall with a wavy, scalloped profile. Scalloping is particularly a problem when the etched trench is to be used as a mold in a subsequent process and when the silicon trench surface is to be used in an optical component.

Another problem which occurs when etching a trench in silicon in an SOI (silicon-on-insulator) structure is known as notching. Notching occurs as the etch front approaches the silicon/dielectric interface. When an etchant gas (such as $SF_6$) which has a high selectivity for etching silicon relative to an underlying oxide layer is used during the etch process, etchant species accumulate at the base of the trench. As etching progresses, and there is little or no silicon left at the base of the trench to be etched in a vertical direction, lateral etching into the silicon sidewall at the bottom of the trench continues, resulting in a severely undercut, notched profile at the base of the trench. Notching is particularly a problem when etching closely spaced trenches. If notching is severe, the bases of adjacent trenches could be joined. Such joining at the bottom of the trenches leads to subsequent device failure. FIG. 2 shows a cross-sectional schematic of closely spaced, adjacent trenches 210, 220, which have been formed in a silicon substrate 202 overlying a dielectric material 200. Trenches 210 and 220 have been joined at their respective bases 212, 222, due to severe notching as a result of a silicon trench etch process. The sidewalls 214, 224 of trenches 210 and 220 also exhibit scalloping.

SUMMARY OF THE INVENTION

We have developed a method of etching a trench in silicon overlying a dielectric material which reduces or substantially eliminates notching at the base of the trench, while reducing scalloping on the sidewalls of the trench.

In one embodiment of the method, a first portion of a trench is etched by exposing a silicon substrate, through a patterned masking layer, to a plasma generated from a fluorine-containing gas. The fluorine-containing gas typically comprises at least 70 volume % of the plasma source gas used during etching. This etching is followed by a polymer deposition step comprising exposing the substrate to a plasma generated from a gas which is capable of forming a polymer on etched silicon surfaces. The etching and polymer deposition steps are repeated for a number of cycles, depending on the desired depth of the first portion of the trench. The desired depth of the first portion of the trench is typically dependent on the final desired trench depth. For relatively shallow trenches, the depth of the first portion of the trench is typically at least 50%, and more typically, at least 70%, of the final desired trench depth. For deeper trenches, the depth of the first portion of the trench is typically about 90% of the final desired trench depth.

The final portion of the trench is etched by exposing the silicon to a plasma generated from a combination of a fluorine-containing gas and a polymer-forming gas. The volumetric ratio of the fluorine-containing gas to the polymer-forming gas is typically within the range of about 1:1 to about 20:1, and more typically, within the range of about 8:1 to about 10:1.

The fluorine-containing gas used during etching is typically $SF_6$, $CF_4$, $NF_3$, or a combination thereof, and is most typically $SF_6$. The polymer-forming gas is typically, but not limited to, a carbon-containing gas, such as $C_4F_8$, $CH_2F_2$, $CHF_3$, or $CF_4$. During the polymer deposition step, the polymer-forming gas may also be HBr or other compounds capable of reacting with silicon to form a polymer. However, during the combined etching/passivation step, we recommend the use of a carbon-containing compound as the polymer-forming gas.

The combined etching/passivation step successfully eliminates notching at the interface of the silicon substrate and the underlying dielectric.

In an alternative embodiment of the method, the entire trench depth is etched by exposing the silicon, through a patterned masking layer, to a plasma generated from a combination of a fluorine-containing gas and a polymer-forming gas. The silicon etch rate is slower with the single-step embodiment than with the embodiment described above. Also, the selectivity for etching silicon relative to an overlying photoresist masking layer is lower with the single-step embodiment. Therefore, the depth of trenches which may be etched using the single-step embodiment is typically limited by the thickness of the photoresist layer which can be applied.

BRIEF DESCRIPTION OF THE DRAWINGS

FIG. 3A shows a typical starting structure 300 for performing the silicon etching embodiment of the method. Structure 300 comprises a patterned masking layer 306, overlying a silicon substrate 304, which overlies a dielectric material 302.

FIG. 3B shows the structure 300 of FIG. 3A after etching of a trench 308 to about 90% of its final desired depth using alternating etching and polymer deposition steps.

FIG. 3C shows the structure 300 of FIG. 3B after etching of trench 308 to its final desired depth. The combined etching/passivation step successfully eliminates notching at the interface 310 of the silicon substrate 304 and the underlying dielectric 302.

DETAILED DESCRIPTION OF EXEMPLARY EMBODIMENTS

Disclosed herein is a method of eliminating notching at the silicon/dielectric interface of an SOI structure during etching of a trench in silicon. Exemplary processing conditions for performing the method of the invention are set forth below.

As a preface to the detailed description, it should be noted that, as used in this specification and the appended claims, the singular forms "a", "an", and "the" include plural referents, unless the context clearly dictates otherwise.

I. An Apparatus for Practicing the Invention

The embodiment example etch processes described herein were carried out in a CENTURA® Integrated Processing System available from Applied Materials, Inc., of Santa Clara, Calif. This apparatus is described in detail below; however, it is contemplated that other apparatus known in the industry may be used to carry out the invention.

Figure 4A:
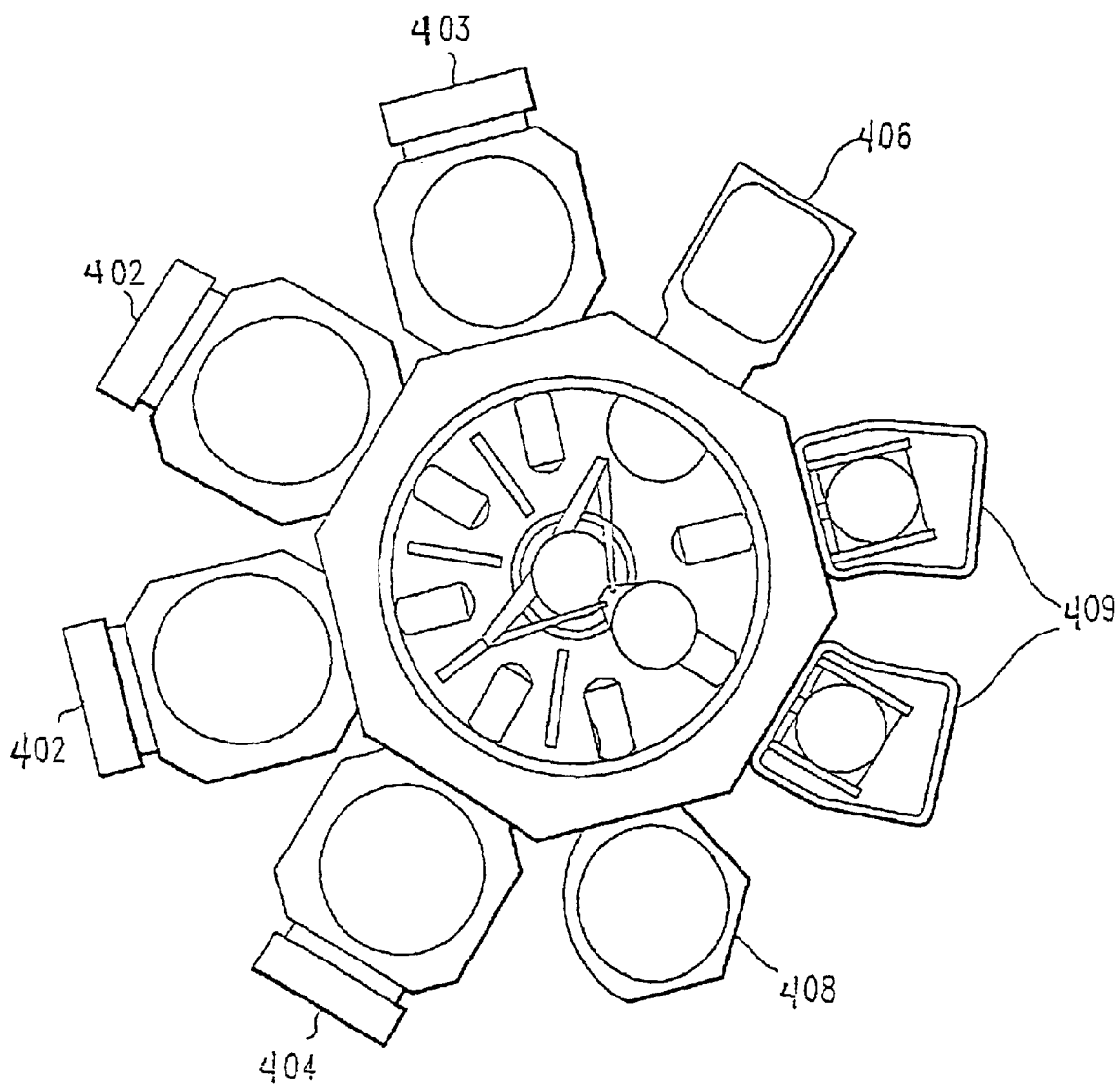
FIG. 4A shows a schematic of a multi-chambered semiconductor processing system of the kind which can be used to carry out the processes described herein.

FIG. 4A shows an elevation schematic of the CENTURA® Integrated Processing System. The CENTURA® Integrated Processing System is a fully automated semiconductor fabrication system, employing a single-wafer, multi-chamber, modular design which accommodates 200-mm or 300-mm wafers. For example, as shown in FIG. 4A, the CENTURA® etch system may include decoupled plasma source (DPS) etch chambers 402; deposition chamber 403; advanced strip-and-passivation (ASP) chamber 404; wafer orienter chamber 406; cooldown chamber 408; and independently operated loadlock chambers 409.

Figure 4B:
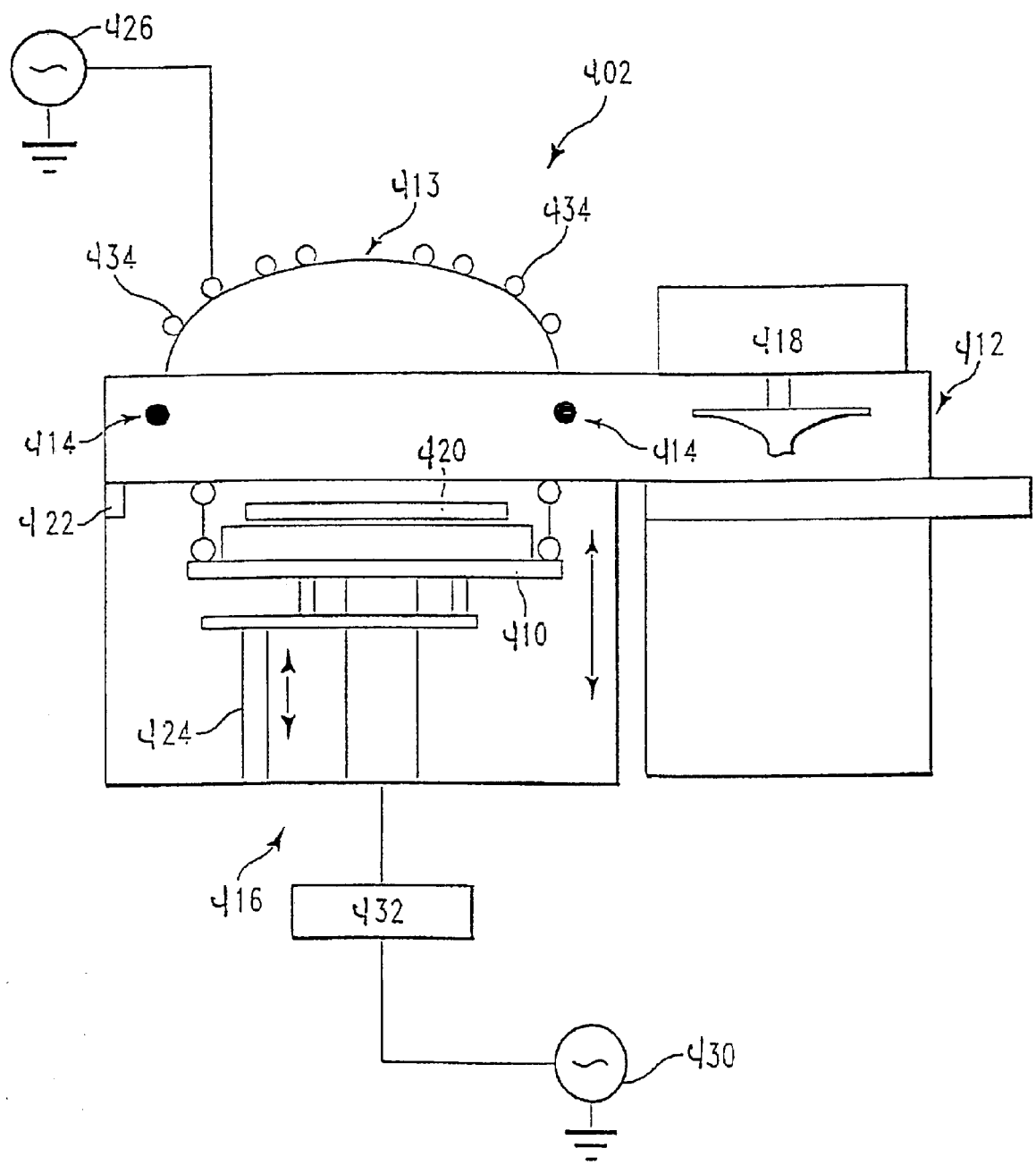
FIG. 4B shows a schematic of a cross-sectional view of a plasma etch chamber of the kind which can be used to carry out the etching processes described herein.

FIG. 4B is a schematic of an individual CENTURA® DPS™ etch chamber 402 of the type which may be used in the Applied Materials' CENTURA® Integrated Processing System. The equipment shown in schematic in FIG. 4B includes a Decoupled Plasma Source (DPS) of the kind described by Yan Ye et al. at the Proceedings of the Eleventh International Symposium of Plasma Processing, May 7, 1996, and as published in the Electrochemical Society Proceedings, Volume 96-12, pp. 222–233 (1996). The CENTURA® DPS™ etch chamber 402 is configured to be mounted on a standard CENTURA® mainframe.

The CENTURA® DPS™ etch chamber 402 consists of an upper chamber 412 having a ceramic dome 413, and a lower chamber 416. The lower chamber 416 includes an electrostatic chuck (ESC) cathode 410. Gas is introduced into the chamber via gas injection nozzles 414 for uniform gas distribution. Chamber pressure is controlled by a closed-loop pressure control system (not shown) with a throttle valve 418. During processing, a substrate 420 is introduced into the lower chamber 416 through inlet 422. The substrate 420 is held in place by means of a static charge generated on the surface of electrostatic chuck (ESC) cathode 410 by applying a DC voltage to a conductive layer located under a dielectric film on the chuck surface. The cathode 410 and substrate 420 are then raised by means of a wafer lift 424 and a seal is created against the upper chamber 412 in position for processing. Etch gases are introduced into the upper chamber 412 via the ceramic gas injection nozzles 414. The etch chamber 402 uses an inductively coupled plasma source power 426 operating at 2 MHz, which is connected to inductive coil 434 for generating and sustaining a high density plasma. The wafer is biased with an RF source 430 and matching network 432 operating within the range of 100 kHz to 13.56 MHz; more typically, within the range of 100 kHz to MHz. Power to the plasma source 426 and substrate biasing means 430 are controlled by separate controllers (not shown).

The temperature on the surface of the etch chamber walls is controlled using liquid-containing conduits (not shown) which are located in the walls of the etch chamber 402. The temperature of the semiconductor substrate is controlled using the temperature of the electrostatic chuck cathode 410 upon which the substrate 420 rests. Typically, a helium gas flow is used to facilitate heat transfer between the substrate and the pedestal.

As previously mentioned, although the etch process chamber used to process the substrates described in the Examples presented herein is shown in schematic in FIG. 4B, any of the etch processors available in the industry should be able to take advantage of the etch chemistry described herein, with some adjustment to other process parameters.

II. Exemplary Method of the Invention for Etching a Trench in a Silicon-on-Insulator (SOI) Structure Applicants have discovered a method for etching a trench in silicon overlying a dielectric material which reduces or substantially eliminates notching at the base of the trench, while reducing scalloping on the sidewalls of the trench.

Figure 1:
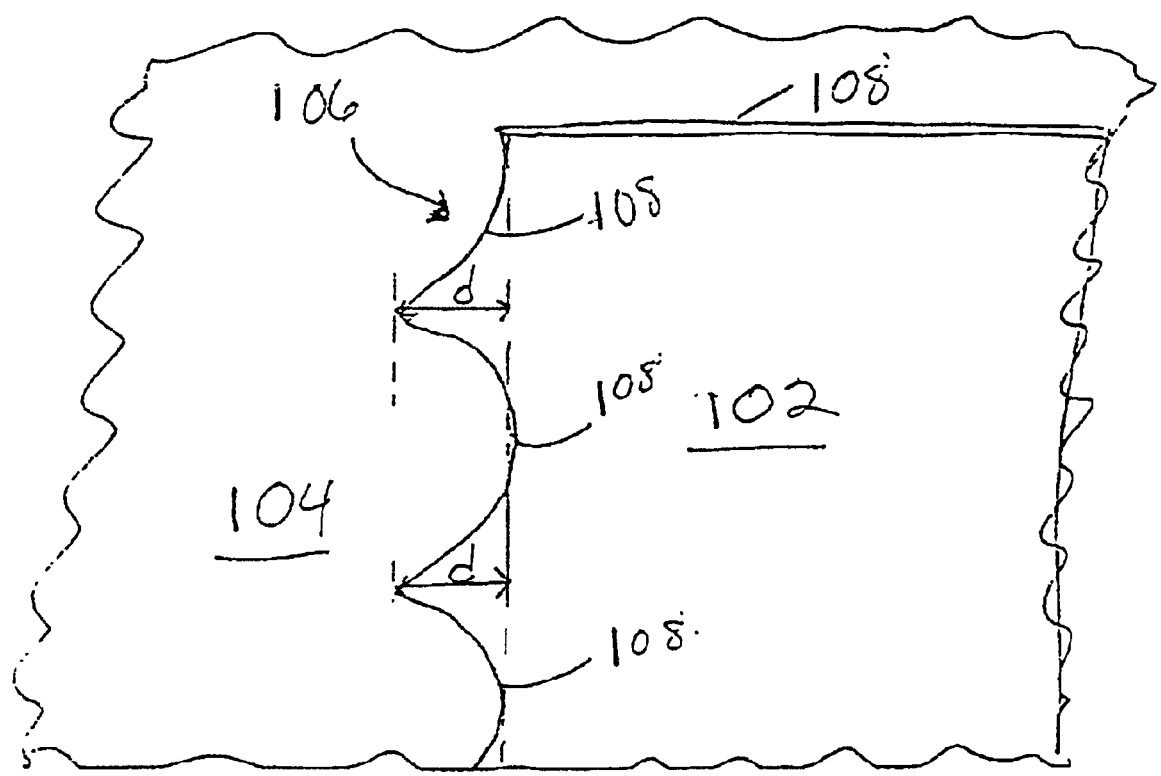
FIG. 1 shows a silicon trench sidewall 106 exhibiting 0.8 micron deep (d) scallops 108.
Figure 2:
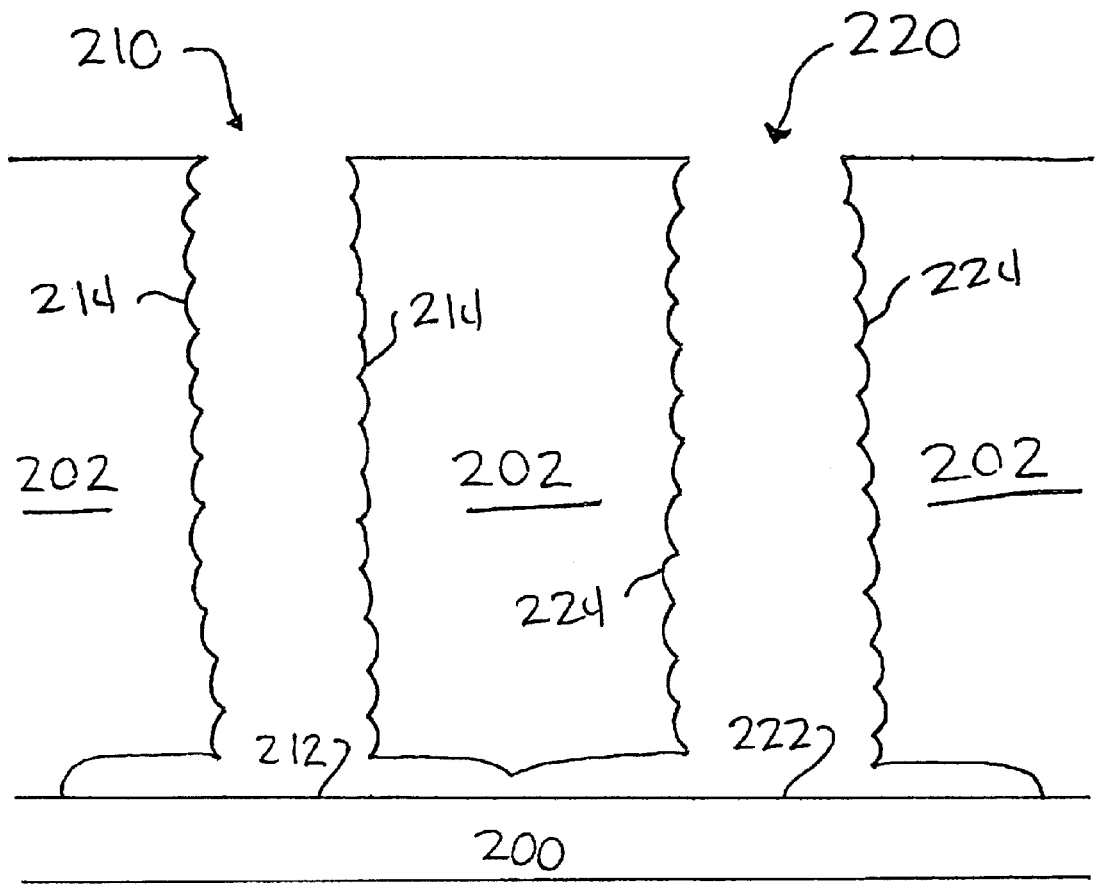
FIG. 2 shows a cross-sectional schematic of closely spaced, adjacent trenches 210, 220, which have been formed in a silicon substrate 202 overlying a dielectric material 200. Trenches 210 and 220 have been joined at their respective bases 212, 222, due to severe notching as a result of a silicon trench etch process. The sidewalls 214, 224 of trenches 210 and 220 also exhibit scalloping.
Figure 3A:
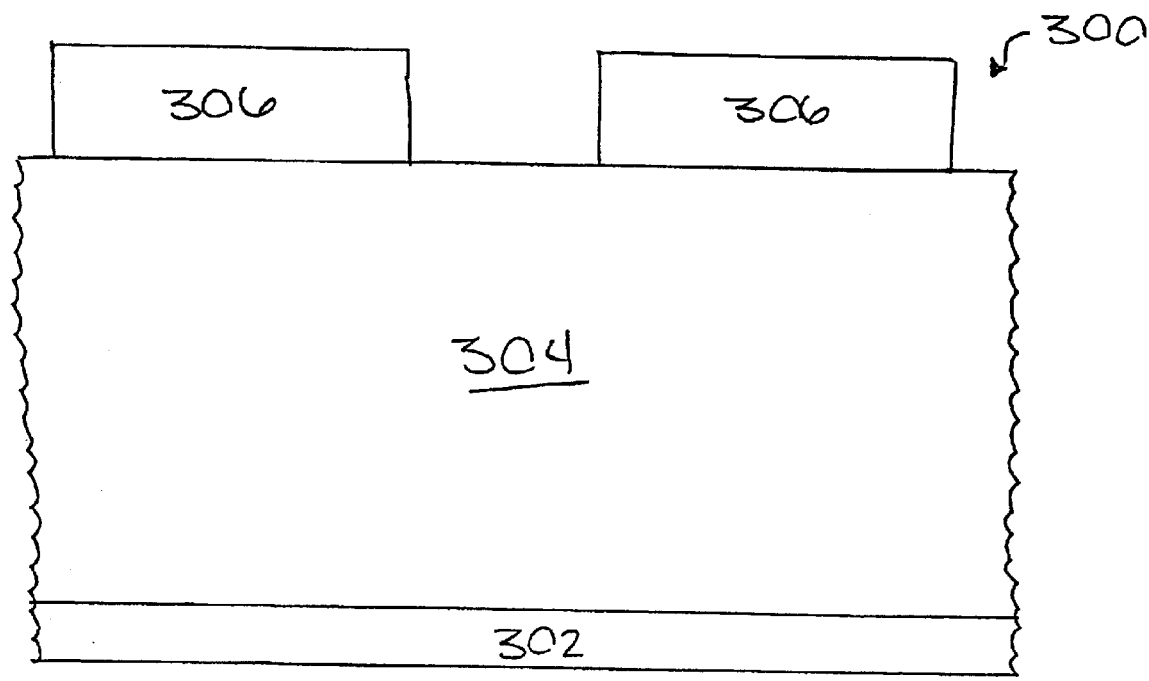
FIGS. 3A–3C illustrate a method embodiment of the invention for etching a trench in silicon overlying a dielectric material.

FIG. 3A shows a typical starting structure 300 for performing the silicon etching method. Structure 300 comprises a patterned masking layer 306, overlying a silicon substrate 304, which overlies a dielectric material 302. Masking layer 306 may comprise either an organic-based photoresist, a silicon-based imageable masking material, or a hard mask material, such as, for example and not by way of limitation, silicon oxide, silicon nitride, or silicon oxynitride. Deposition and patterning of the masking layer are performed using techniques known in the art, depending on the particular masking material used.

If a photoresist is used as the masking material, an organic-based photoresist thickness within the range of about 2 $\mu$m to about 4 $\mu$m is typically required for etching a 100 $\mu$m deep trench. If a hard mask is used, a hard mask material thickness within the range of about 1 $\mu$m to about 2 μm is typically required for etching a 100 μm deep trench. The masking layer 306 may be a dual layer comprising a layer of photoresist overlying a layer of a hard mask material.

As used herein, the term "silicon" includes both polysilicon and single-crystal silicon. The silicon 304 may be undoped or doped. Doping of the silicon may be performed according to methods known in the art.

The dielectric material 302 is typically silicon oxide, but may alternatively be silicon nitride, silicon oxynitride, or another suitable dielectric material, depending on the desired final device structure.

According to one embodiment of the method, the silicon substrate 304 is etched by exposing the silicon 304 to a plasma generated from a fluorine-containing gas. The fluorine-containing gas typically comprises at least 70 volume % of the plasma source gas used during etching.

The fluorine-containing gas is typically selected from the group consisting of $SF_6$, $CF_4$, $NF_3$, and combinations thereof. Sulfur hexafluoride ($SF_6$) has been shown to provide particularly good results. The plasma source gas may optionally include a nonreactive, diluent gas, such as, for example and not by way of limitation, argon, helium, xenon, krypton, and combinations thereof.

Typical process conditions for performing a silicon etching step of the method are provided in Table One, below.

TABLE One

Process Conditions for Silicon Etching Step

| Process Parameter | Range of Process Conditions | Typical Process Conditions |
| --- | --- | --- |
| $SF_6$ Flow Rate (sccm) | 100–500 | 200–300 |
| Ar Flow Rate (sccm) | 0–100 | 0 |
| Plasma Source Powder (W) | 500–2000 | 1000–2000 |
| Substrate Bias Powder (W) | 0–50 | 10–20 |
| Substrate Bias Voltage (–V) | 0–50 | 10–20 |
| Process Chamber Pressure (mTorr) | 10–300 | 100–200 |
| Substrate Temperature (° C.) | 0–100 | 10–20 |
| Etch Time Period (seconds) | 2–15 | 5–10 |

In a second step in the method embodiment, silicon substrate 304 is exposed to a plasma generated from a gas which is capable of forming a polymer on etched silicon surfaces. The polymer-forming gas is typically, but not limited to, a carbon-containing gas, such as $C_4F_8$, $CH_2F_2$, $CHF_3$, or $CF_4$. $C_4F_8$ has been shown to provide good results. The polymer-forming gas may also be HBr or other compounds capable of reacting with silicon to form a polymer. Hydrogen from the HBr can react with carbon from a photoresist masking layer to form an organic polymer. Alternatively, if a silicon oxide masking layer is used, bromine from the HBr can react with oxygen from the oxide masking layer and silicon from the substrate being etched to form silicon oxybromide, a nonvolatile etch byproduct which deposits on etched silicon surfaces.

Typical process conditions for performing the polymer deposition step of the embodiment are provided in Table Two, below:

TABLE Two

Process Conditions for Polymer Deposition Step

| Process Parameter | Range of Process Conditions | Typical Process Conditions |
| --- | --- | --- |
| $C_4F_8$ Flow Rate (sccm) | 50–200 | 100–150 |
| Plasma Source Powder (W) | 500–2000 | 1000–1500 |

TABLE Two-continued

Process Conditions for Polymer Deposition Step

| Process Parameter | Range of Process Conditions | Typical Process Conditions |
| --- | --- | --- |
| Substrate Bias Power (W) | 0 | 0 |
| Substrate Bias Voltage (–V) | 0 | 0 |
| Process Chamber Pressure (mTorr) | 10–50 | 20–30 |
| Substrate Temperature (° C.) | 0–100 | 10–20 |
| Polymer Deposition Time Period (seconds) | 2–10 | 5–6 |

According to this embodiment of the method, a second silicon etching step is now performed. The process conditions used during the second (or third, or fourth, etc.) silicon etching step may be the same or different from those used in the first silicon etching step, but typically fall within the process condition ranges provided in Table One, above. The plasma source power, for example, may be varied from silicon etch step to silicon etch step, or the substrate bias voltage may be varied, so that the etch profile can be closely controlled and defined.

The etching and polymer deposition steps are repeated for a number of cycles, depending on the desired depth of the first portion of the trench. The desired depth of the first portion of the trench is typically dependent on the final desired trench depth. For relatively shallow trenches, the depth of the first portion of the trench is typically at least 50%, and more typically, at least 70%, of the final desired trench depth. For deeper trenches, the depth of the first portion of the trench is typically about 90% of the final desired trench depth.

Figure 3B:
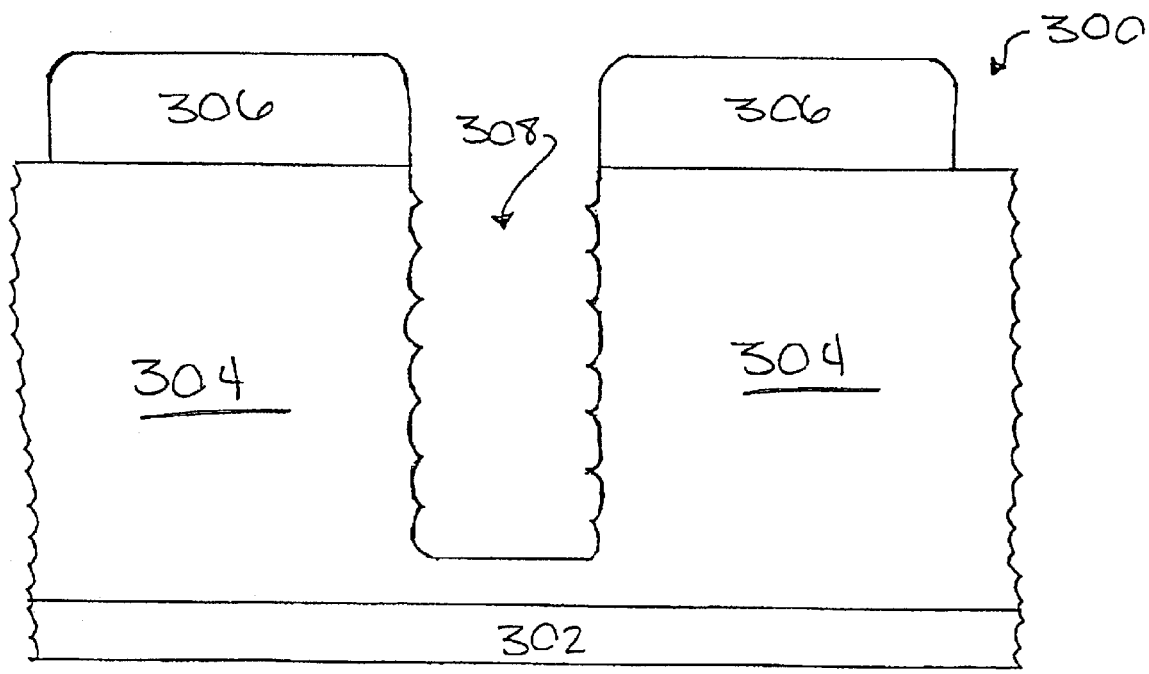

FIG. 3B shows the structure 300 of FIG. 3A after etching of a trench 308 to about 90% of its final desired depth using alternating etching and polymer deposition steps, as described above.

Etching of the final portion of the trench is performed using a plasma generated from a combination of a fluorine-containing gas and a polymer-forming gas. The volumetric ratio of the fluorine-containing gas to the polymer-forming gas is typically within the range of about 1:1 to about 20:1, and more typically, within the range of about 8:1 to about 10:1.

The fluorine-containing gas is typically $SF_6$, $CF_4$, $NF_3$, or a combination thereof, and is most typically $SF_6$. The polymer-forming gas is typically a carbon-containing gas, such as $C_4F_8$, $CH_2F_2$, $CHF_3$, or $CF_4$.

The plasma source gas may optionally include a nonreactive, diluent gas, such as, for example and not by way of limitation, argon, helium, xenon, krypton, and combinations thereof.

Typical process conditions for performing the combined etching/passivation step of the embodiment are provided in Table Three, below:

TABLE Three

Process Conditions for Combined Etching/Passivation Step

| Process Parameter | Range of Process Conditions | Typical Process Conditions |
| --- | --- | --- |
| $SF_6$ Flow Rate (sccm) | 50–500 | 100–300 |
| $C_4F_8$ Flow Rate (sccm) | 10–200 | 20–50 |
| Plasma Source Power (W) | 500–2000 | 1000–1500 |

TABLE Three-continued

Process Conditions for Combined Etching/Passivation Step

| Process Parameter | Range of Process Conditions | Typical Process Conditions |
|---|---|---|
| Substrate Bias Power (W) | 10–50 | 10–20 |
| Substrate Bias Voltage (–V) | 10–50 | 10–20 |
| Process Chamber Pressure (mTorr) | 20–300 | 100–200 |
| Substrate Temperature (° C.) | 0–100 | 10–20 |
| Combined Etching/Passivation Step Time Period (seconds) | 2–15 | 5–10 |

Figure 3C:
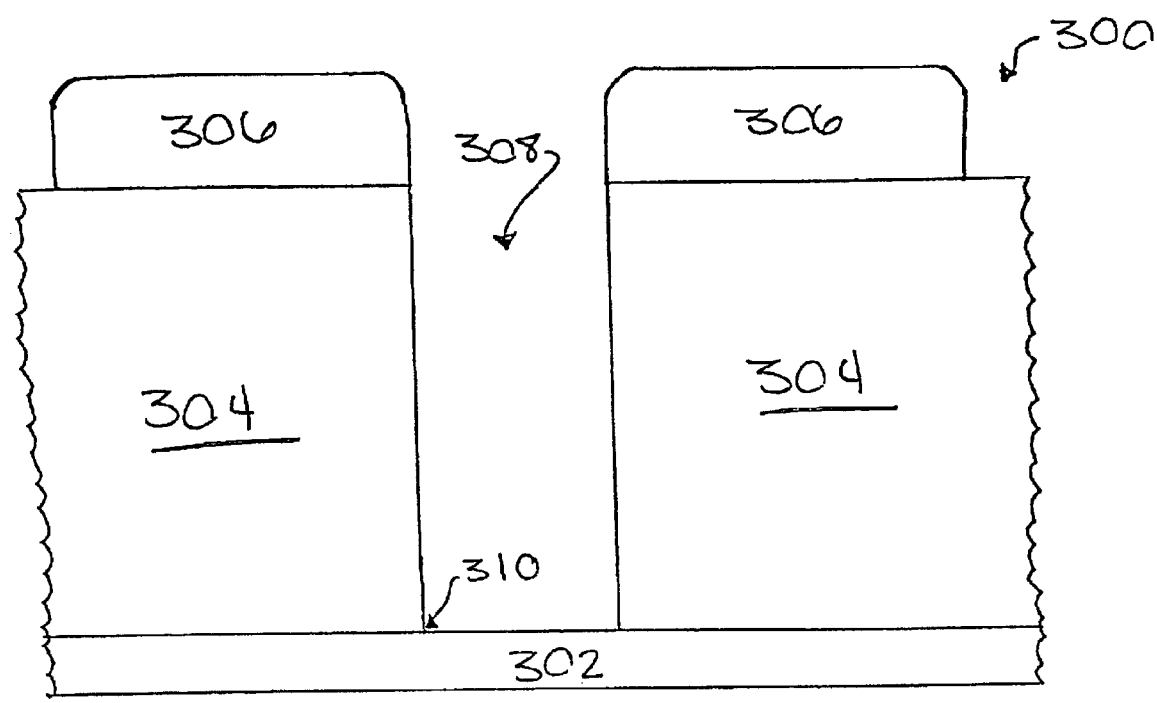

FIG. 3C shows the structure 300 of FIG. 3B after etching of trench 308 to its final desired depth. The combined etching/passivation step successfully eliminates notching at the interface 310 of the silicon substrate 304 and the underlying dielectric 302.

We have discovered that the severity of notching is a function of the etched feature size. As used herein, the term "feature size" refers to the smallest dimension of a feature such as a trench (typically, the shortest distance between opposing sidewalls of a feature). In particular, we have found that notching appears to be most severe for feature sizes within the range of about 1 micron to about 6 microns. Accordingly, the present method is particularly useful for etching of trenches having a feature size within that range.

The combined etching/passivation step provides a slower etch rate than the alternating etching and polymer deposition steps. For example, the average silicon etch rate may decrease from more than 2 microns per minute during the alternating etching and polymer deposition steps, to 0.5 micron per minute or less during the combined etching/passivation step. Therefore, the average silicon etch rate achieved will depend on the relative proportion of the trench etched using the alternating etching and polymer deposition steps versus the combined etching/passivation step. For deeper trenches, it is preferred to etch about 90% of the trench depth using the alternating etching/polymer deposition steps in order to achieve an optimum silicon etch rate. For shallower trenches, a relatively greater proportion of the trench depth can be etched using the combined etching/passivation step.

In an alternative embodiment of the method, the entire trench depth is etched by exposing the silicon, through a patterned masking layer, to a plasma generated from a combination of a fluorine-containing gas and a polymer-forming gas. Typical process conditions for performing the single-step embodiment are within the ranges provided in Table Three, above.

The silicon etch rate is slower with the single-step embodiment than with the embodiment described above. Also, the selectivity for etching silicon relative to an overlying photoresist masking layer is lower with the single-step embodiment. Therefore, the depth of trenches which may be etched using the single-step embodiment is typically limited by the thickness of the photoresist layer which can be applied. However, the single-step embodiment is attractive from a convenience standpoint for the etching of shallower trenches.

The above described exemplary embodiments are not intended to limit the scope of the present invention, as one skilled in the art can, in view of the present disclosure expand such embodiments to correspond with the subject matter of the invention claimed below.

We claim:

1. A method of etching a trench in silicon overlying a dielectric material, which reduces notching at a silicon-dielectric interface, wherein the method includes:
   a) etching a first portion, which is at least 50%, of a desired nominal trench depth by alternatingly performing the following steps,
      i) an etching step comprising exposing the silicon, through a patterned masking layer, to a plasma generated from a fluorine-containing gas, and
      ii) a polymer deposition step comprising exposing the silicon to a plasma generated from a gas which is capable of forming a polymer on etched silicon surfaces; and
   b) etching at least the final 10% of said trench to said desired nominal depth by exposing said silicon to a plasma generated from a combination of a fluorine-containing gas and a polymer-forming gas.

2. The method of claim 1, wherein said first portion of said trench is etched to a depth which is at least 70% of said final desired nominal trench depth.

3. The method of claim 2, wherein said first portion of said trench is etched to a depth which is about 90% of said final desired trench depth.

4. The method of claim 1, wherein said trench has a feature size within the range of about 1 micron to about 6 microns.

5. The method of claim 1, wherein said fluorine-containing gas is selected from the group consisting of $SF_6$, $CF_4$, $NF_3$, and combinations thereof.

6. The method of claim 5, wherein said fluorine-containing gas is $SF_6$.

7. The method of claim 1, wherein said step b) halogen-containing, polymer-forming gas is a carbon-containing gas.

8. The method of claim 7, wherein said halogen-containing, carbon-containing gas is selected from the group consisting of $C_4F_8$, $CH_2F_2$, $CHF_3$, $CF_4$, and combinations thereof.

9. The method of claim 8, wherein said carbon-containing gas is $C_4F_8$.

10. The method of claim 1, wherein said polymer-forming gas used in step a) is a gas which reacts with silicon to form a polymer.

11. The method of claim 1, wherein a volumetric ratio of said fluorine-containing gas to said polymer-forming gas in step b) is within the range of about 1:1 to about 20:1.

12. The method of claim 11, wherein a volumetric ratio of said fluorine-containing gas to said polymer-forming gas in step b) is within the range of about 8:1 to about 10:1.

13. The method of claim 1, wherein said dielectric material is silicon oxide.

14. The method of claim 1, wherein said masking layer comprises a photoresist.

15. The method of claim 1, wherein said masking layer comprises a material selected from the group consisting of silicon oxide, silicon nitride, and silicon oxynitride.

16. A method of etching a trench in silicon overlying a dielectric material, wherein said method comprises exposing said silicon, through a patterned masking layer, to a plasma generated from a combination of a fluorine-containing gas and a halogen-containing, polymer-forming gas, said plasma at a pressure ranging from about 20 mTorr to about 300 mTorr, wherein the entire trench depth is etched in a single etching step, and whereby notching at an interface between said silicon and said dielectric is reduced.

17. The method of claim 16, wherein said trench has a feature size within the range of about 1 micron to about 6 microns.

18. The method of claim 16, wherein said fluorine-containing gas is selected from the group consisting of $SF_6$, $CF_4$, $NF_3$, and combinations thereof.

19. The method of claim 18, wherein said fluorine-containing gas is $SF_6$.

20. The method of claim 16, wherein said halogen-containing, polymer-forming gas is a carbon-containing gas selected from the group consisting of $C_4F_8$, $CH_2F_2$, $CHF_3$, $CF_4$, and combinations thereof.

21. The method of claim 20, wherein said carbon-containing gas is $C_4F_8$.

22. The method of claim 16, wherein a volumetric ratio of said fluorine-containing gas to said halogen-containing, polymer-forming gas is within the range of about 1:1 to about 20:1.

23. The method of claim 22, wherein a volumetric ratio of said fluorine-containing gas to said halogen-containing, polymer-forming gas is within the range of about 8:1 to about 10:1.

24. The method of claim 16, wherein said dielectric material is silicon oxide.

25. The method of claim 16, wherein said masking layer comprises a photoresist.

26. The method of claim 16, wherein said masking layer comprises a material selected from the group consisting of silicon oxide, silicon nitride, and silicon oxynitride.

27. The method of claim 10, wherein said gas which reacts with silicon to form a polymer is HBr.

28. A method of reducing notching at a silicon-dielectric interface of an SOI structure during etching of a trench in silicon, said method comprising:

providing a trench in a silicon layer, which trench is etched to at least 50% of a desired nominal trench depth; and etching at least the final 10% of the desired nominal trench depth by exposing the silicon layer to a plasma generated from a combination of a fluorine-containing gas and a halogen-containing, polymer-forming gas.

29. The method of claim 16, wherein said plasma is generated from a combination of gases consisting essentially of a fluorine-containing gas and a halogen-containing, polymer-forming gas.

* * * * *